INVENTORS
WARREN B. BRUENE
TOM L. DENNIS JR.
EDGAR O. SCHOENIKE
BY Moody and Kintzinger
ATTORNEYS INVENTORS
WARREN B. BRUENE
TOM L. DENNIS JR.
EDGAR O. SCHOENIKE
BY
Moody and Kintzinger
ATTORNEYS INVENTORS
WARREN B. BRUENE
TOM L. DENNIS JR.
EDGAR O. SCHOENIKE
BY
Moody and Kintinger
ATTORNEYS

United States Patent Office 3,413,570

Patented Nov. 26, 1968

3,413,570

HIGH EFFICIENCY RF POWER AMPLIFICATION WITH MODULATION SIGNAL CONTROLLED "ON"-"OFF" SWITCH VARIED AMPLIFIER DC POTENTIALS

Warren B. Bruene, Dallas, Tex., and Tom L. Dennis, Jr., Cedar Rapids, and Edgar O. Schoenike, Ames, Iowa, assignors to Collins Radio Company, Cedar Rapids, Iowa, a corporation of Iowa Filed Feb. 23, 1966, Ser. No. 529,380
18 Claims. (Cl. 332—9)

Figure 1:
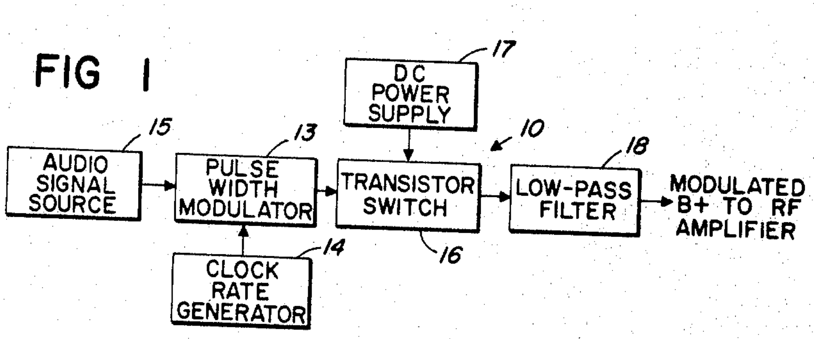

This invention relates in general to radio frequency amplifying systems, and in particular, to high efficiency linear and nonlinear amplifiers with instantaneous RF amplifier DC potential voltages continuously varied to match signal level requirements to maintain high efficiency operation throughout the designed range of input signal levels.

Speech, for example, presents a signal envelope varying in amplitude at the syllabic rate generally in the frequency range of .5 to 25 c.p.s. with the average being about 5 c.p.s. The amplitude of such speech variations runs through a considerable amplitude range of variations throughout normal speech. When speech is translated to radio frequencies as a single or double sideband suppressed carrier signal, the RF envelope contains high audio frequency components as well as the low frequency syllabic components. Class AB linear amplifiers are commonly used to amplify such signals in radio transmitters.

Such amplifiers reach their peak efficiency only at peak output capability which is required for only a relatively small fraction of the time. Hence, most of the time such amplifiers are operating at much less than peak efficiency. For a class B amplifier efficiency is given by the relation eff.$=\pi e_p/4E_b$, with $e_p$ the peak RF collector or plate voltage for a transistor amplifier or amplifier tube, and $E_b$ is the collector or plate supply voltage. If $E_b$ can be varied in accordance with the audio input signal so that it is just sufficient to maintain constant gain without clipping, the efficiency can be maintained nearly constant at a very high level over the entire variations in amplitude brought about by such speech or other audio input signals. Maximum efficiency is achieved when $E_b$ follows the RF signal envelope. A very substantial improvement in efficiency, however, can still be achieved if $E_b$ just follows the low frequency syllabic component of a speech signal envelope. This compromise in efficiency is often most practical since circuit performance requirements are greatly reduced. In either case such RF linear amplifier distortion reducing means such as envelope or RF feedback can still be employed.

Such increase in efficiency with power amplifiers results in a decrease of heat that must be dissipated thereby advantageously permitting denser packaging of electronic components and circuitry, longer component life and a reduction in blower requirements and/or other heat sink or exchanger requirements. It also results in reduced power consumption which is very advantageous in battery powered equipment. It should be noted, however, that unless a variable supply voltage can be efficiently produced there would be no overall increase in system efficiency. For example, use of a losser type regulator with a transistor or tube in series with the voltage supply would dissipate in the regulator power saved by higher efficiency in the RF amplifier. Therefore, obviously, a high efficiency power supply modulator is necessary in order to make possible the attainment of high overall system operational efficiency.

It is, therefore, a principal object of this invention, with such linear amplifying systems, to maintain RF amplifier substantially instantaneous DC voltage at such a variable value that it is just sufficient to accommodate the RF signal level at that instant without peak limiting.

Another object is to provide a power supply modulator and linear amplifier system that does not require that the average value of DC voltage applied to the modulated tube elements or other amplifying device electrodes be constant.

A still higher efficiency means of providing linear amplification of a varying amplitude signal employs a nonlinear RF power amplifier which is modulated by varying its supply voltages. With the new teaching, an SSB signal may be amplified by using the SSB signal without limiting to drive a class C RF amplifier and modulating the plate of the amplifier with a voltage obtained by detecting the original SSB envelope.

A switching type amplifier that has been developed using transistors is capable of much higher efficiency than class C amplifiers. Efficiencies of 95% have been achieved compared to typically 75% for class C amplifiers.

A further object is to provide very high efficiency linear amplifiers by using a high efficiency switching type amplifier modulated with a high efficiency switching type modulator capable of including the DC component of the signal envelope. The efficiency by such an approach has no theoretical limit under 100% in the ideal case and can actually approach 100% with the practical limit due to circuit losses and saturation-resistance of the switching element.

Various existing AM transmitters have employed amplitude modulation of the amplifier DC potentials with a low level audio amplifier driving a power amplifier so coupled as to provide that the DC on RF amplifier tube elements be varied in proportion to the applied audio signal. One early method was a so-called "Heising" modulation method. Another method used employed a transformer coupled approach and a class B push-pull audio output stage. A third approach used was a combination of the other two in order to remove DC saturating current from the modulation transformer in a system normally applied to high power transmitters. A feature common to these three systems is that the varying audio frequency voltage is inserted across a low DC resistance transformer winding or choke, such that the average value of DC voltage applied to the modulated tube (or other amplifying device) elements is substantially constant. A further common characteristic of such modulator circuits is that they operate with class A or push-pull class B audio amplifiers, and with the push-pull class B configuration obtain a maximum theoretical modulator efficiency approximating 78.5 percent. This efficiency is attained only with a singletone audio input with the plates of the push-pull modulator tubes swinging from zero volts to exactly the modulator DC voltage. Obviously, the peak plate voltage swing must be less than the DC plate voltage which reduces efficiency with such systems and with complex audio input signals operational efficiency is considerably reduced from the 78.5 percent maximum figure.

There have been many modulation schemes devised in attempts to attain improved high operational efficiencies many of which are dependent upon outphasing arrangements requiring careful adjustment of the RF amplifiers and phase networks for each operating frequency.

Class C amplifiers typically have a plate efficiency of 75 percent and class B modulators have typical efficiencies of 65 percent with the formula for calculating the plate efficiency of such a power amplifier and modulator system producing a 100 percent sine wave modulated RF output signal being substantially as follows:

$$\text{eff.}=\frac{1+0.5}{\frac{1}{0.75}+\frac{0.5}{0.75\times 0.65}}=\frac{1.5}{1.33+1.025}=64\%$$

Even this efficiency, however, falls short in the attainment of operational efficiencies desired.

A further object is, therefore, to provide a high efficiency power supply modulator for an RF implifier thereby attaining high efficiency generation of an amplitude modulated RF signal.

Features of this invention useful in accomplishing the above objects include, with both nonlinear and high efficiency linear amplifiers, "on"-"off" switch determined resultant voltage modulation of RF amplifier DC potential voltages to continuously vary such instantaneous voltages to match modulating signal levels. This permits operation of the RF power amplifier stage at substantially 100 percent efficiency (using a nonlinear amplifier or approaching 78.5 percent using a linear amplifier) throughout the designed-for operational range of modulator signal input levels. A high efficiency power modulator and RF amplifier may be adjusted for maintaining RF amplifier substantially instantaneous DC voltage at such a variable value that peak RF voltage at the corresponding moment of time nearly equals the instantaneous DC voltage of that time.

Specific embodiments representing what are presently regarded as the best modes for carrying out the invention are illustrated in the accompanying drawings.

Figure 2:
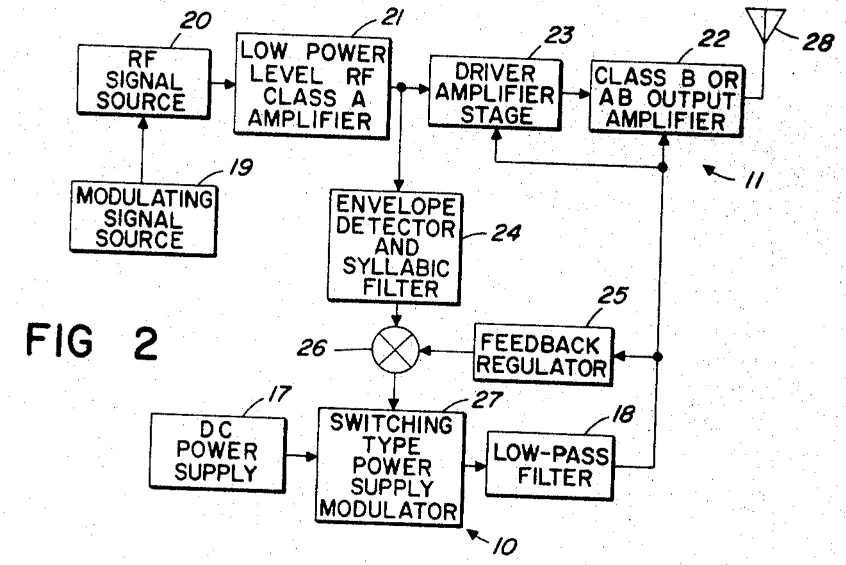
Figure 3:
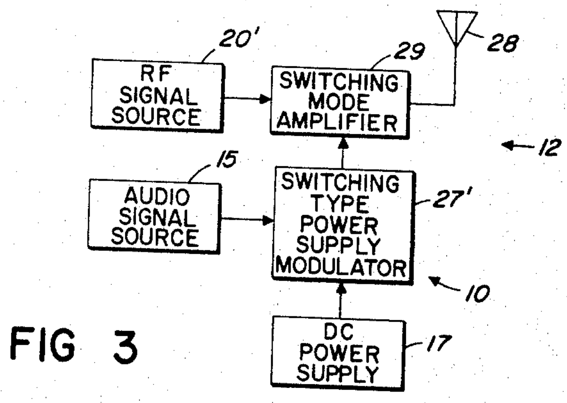
Figure 4:
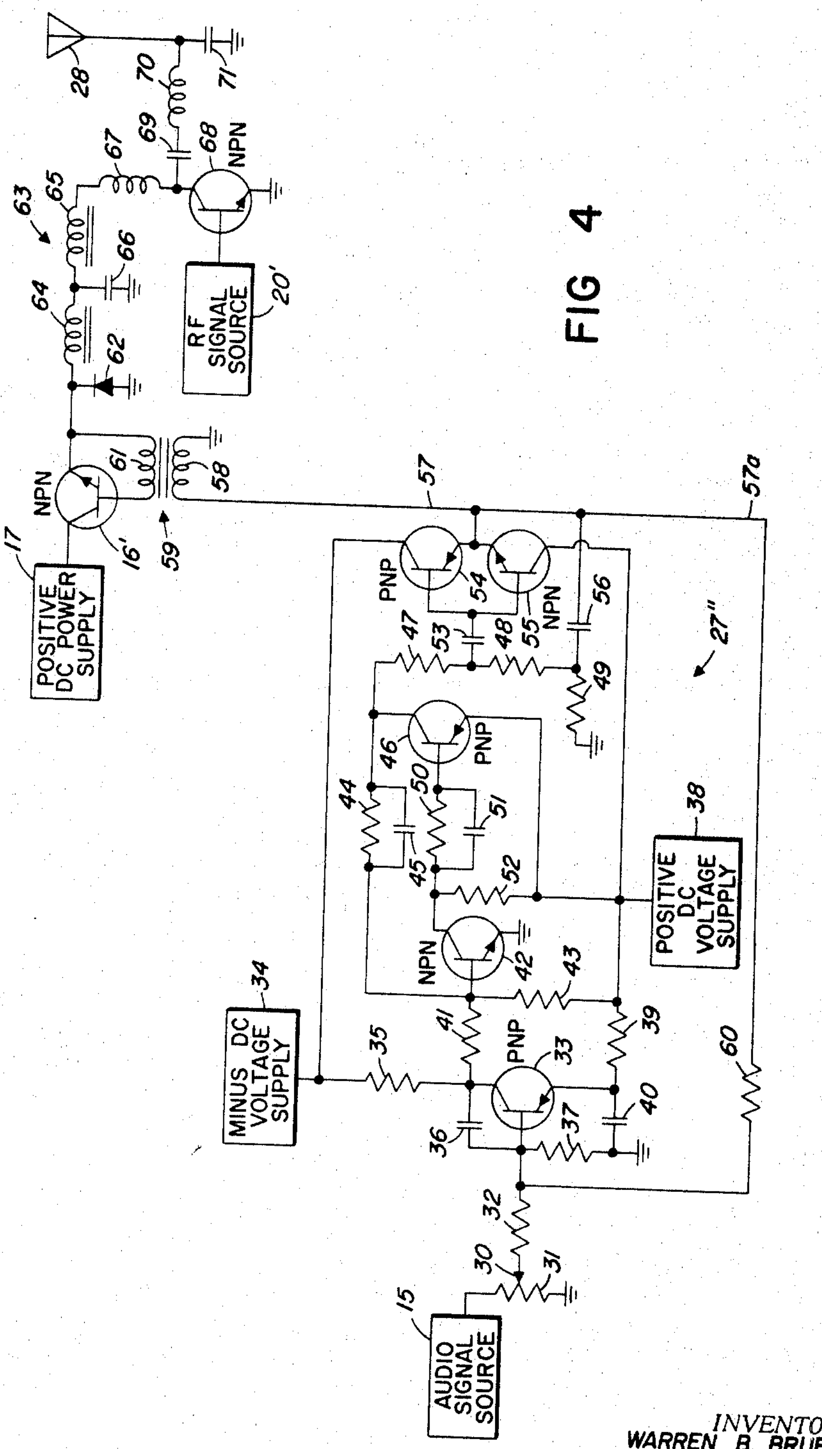
Figure 5:
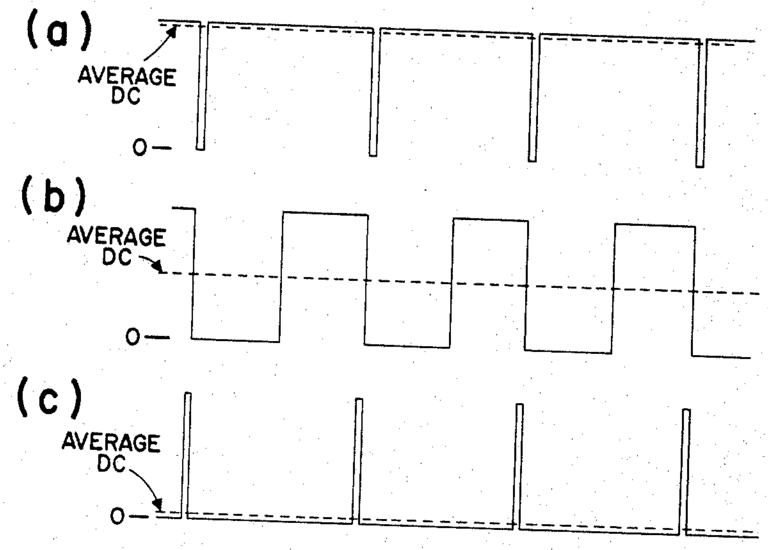
Figure 6:
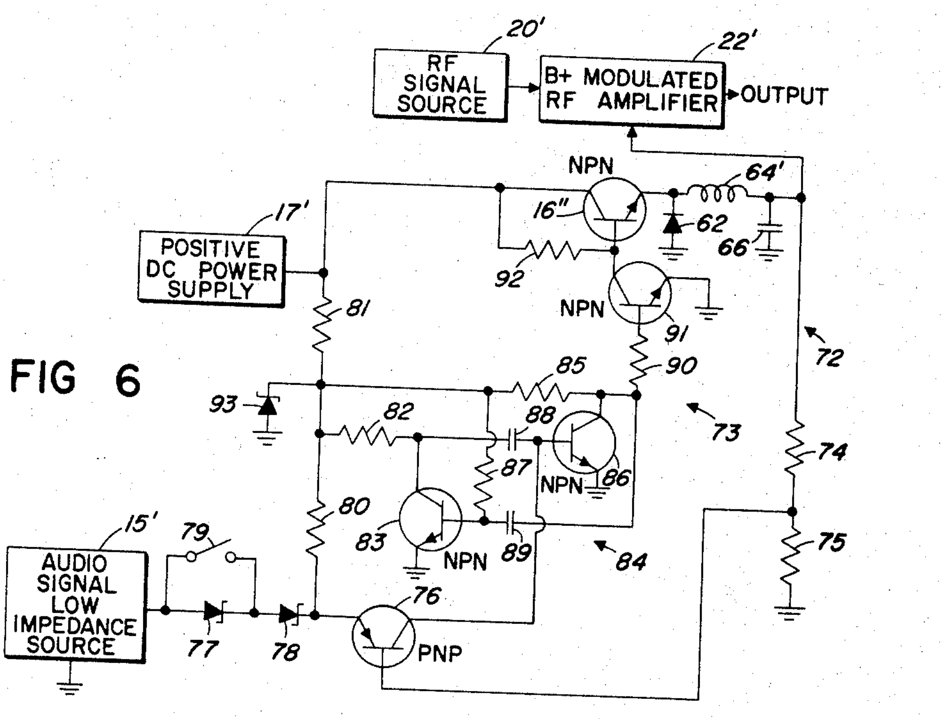

In the drawings:

FIGURE 1 represents a block diagram of a high efficiency modulator;

FIGURE 2, a block diagram of a high efficiency linear amplifier employing a high efficiency modulator such as shown by FIGURE 1;

FIGURE 3, a block diagram of a high efficiency modulated switching mode non-linear RF power amplifier also employing a modulator such as shown by FIGURE 1;

FIGURE 4, a schematic of a high efficiency linear amplifier and of a high efficiency modulator used as a part thereof;

FIGURE 5, *a*, *b* and *c* voltage waveforms at the output of the transistor switch in the high efficiency modulator of FIGURE 1 as it may be used in the embodiments of FIGURES 2, 3, and 4; and, FIGURE 6, a schematic of a high efficiency linear amplifier using an alternate high efficiency modulator embodiment with a substantially constant width "on" period and a variable width "off" period.

Referring to the drawings:

The high efficiency modulator 10 shown in block diagram form in FIGURE 1 may be adapted for use with the high efficiency linear amplifier 11 shown in block diagram form in FIGURE 2 or in the high efficiency modulated switching mode amplifier 12 of FIGURE 3. The high efficiency modulator 10 of FIGURE 1 is shown to have a pulse width modulator 13 receiving an input from a clock rate generator 14 and audio input signal from audio signal source 15. The output of pulse width modulator 13 is applied as a controlling input to a switching element 16 which may actually be a transistor switch. The switching element 16 also received a DC power input from DC power supply 17 for switch controlling the circuit from DC power supply 17 to a low pass filter 18 in the modulator output path supplying, for example, modulated B+ to an RF amplifier.

In the high efficiency linear amplifier 11 of FIGURE 2, the high efficiency modulator 10 as shown in FIGURE 1 is so adapted to the high efficiency linear amplifier circuit that the audio signal source 15 includes a modulating signal source 19 modulating an RF signal source 20 providing a modulated input to a low power level RF class A amplifier 21 having an output which may be applied directly to a class B or class AB output amplifier 22 or through an intermediate class A or class AB driver amplifier stage 23 as shown to the output amplifier 22. The audio signal source 15 also includes an envelope detector and syllabic filter 24 the input connection of which may be connected directly to the output of the low power level class A amplifier 21 or, if these is also a driver amplifier stage 23, alternately to the output of the driver amplifier stage 23 as may be appropriate or as desired.

Furthermore, in the embodiment 11 indicated, the switching type modulator output passed through low pass filter 18 is provided with a feedback circuit through feedback regulator 25 to a mixer 26 included also as a part of the audio signal source circuit 15 between envelope detector and syllabic filter 24 and the switching type power supply modulator portion 27 of the high efficiency modulator 10.

The switching type modulator output passed through low pass filter 18 is also connected as a modulated B+ type voltage to the class B or AB output RF amplifier 22, and may also be connected in like manner as a modulated voltage for the driver amplifier stage 23. In this embodiment, the signal from RF signal source 20 is fed to a low level class A amplifier 21 with the input from RF signal source 20 being typically, as an example, a single sideband speech RF signal. After amplification the signal is fed to the driver stage 23 and through the driver stage with further amplification to the class B or AB output RF amplifier 22, the output of which is passed to antenna 28 or some other load, as may be the case. At some point in the amplification chain, the envelope detector and syllabic filter 24 may be connected possibly between driver stage 23 and amplifier 22 rather than between low power class A amplifier 21 and the driver stage 23, as shown, for extracting the syllabic envelope as an appropriate audio input to the switching type power supply modulator circuit 27. This modulator may be preset, if desired, to put out a minimum DC voltage even in the absence of a signal with this setting used, for example, when for sake of simplicity it is desired to vary only the plate voltage of a tetrode or pentode final amplifier in the output amplifier circuit 22. With such a setting, the modulator circuit 27 would be preset to insure that the minimum plate voltage slightly exceeded the screen voltage where tubes are used in such an output amplifier and in like manner for the corresponding electrodes of solid state devices such as final amplifier transistors. Although such a setting decreases the available circuit efficiency somewhat, a preset minimum output voltage also helps to compensate for unavoidable time delay in the detector modulator path.

As shown and as referred to before, the envelope detector precedes the driver and both driver and output stages have variable supply voltages applied although it might be desirable to feed the driver from fixed supply voltages and envelope detect the output of the driver 23. The low pass filter 18 is in effect a choke input low pass filter filtering out the switching frequency and its harmonics leaving only the syllabic varying DC as a B+ type voltage for output amplifier 22. In the embodiment of FIGURE 2, the feedback regulator 25 introduces a fraction of the output voltage out of low pass filter 18 back to mixer 26 in antiphase such as to improve output regulation with changes in power input voltage and load impedance, to reduce distortion by conventional negative feedback, and also to minimize power supply ripple.

When there are no significant very low frequency amplitude variations in the RF signal from RF signal source 20, as for example, a multi-tone FSK signal (frequency shift keying signal), or when it is desirable to increase the efficiency of a speech SSB system still further, it is necessary to preserve more of the fine structure of the SSB envelope in the power supply modulator circuit 27. When the sideband RF signal is rectified and the RF filtered off by envelope detector and syllabic filter 24, the remaining audio components consist of frequencies resulting from intermodulation of the voice harmonics with the significant portion of the spectrum remaining being a function of the amplitude of various translated frequency components. Since the bandwidth in such a system may be restricted to one and one-third times the audio signal bandwidth, a typical SSB speech system might have a speech bandwidth of 2.4 kc. and the post envelope detector filter 24 circuitry would then have a bandwidth of 0 to 3.2 kc. The minimum clock switching rate of the switching type pulse width modulator circuit 27 could be as low as 6.4 kc. but a more typical switching rate would be approximately 50 kc. in order to minimize filter problems and permit simplification of filter design. It should be noted that in the case of tetrode amplifiers in such a system, screen and bias voltages and corresponding electrode voltages with other amplifying devices that may be used may also be varied by similar means in accordance with the input signal amplitude so that top efficiency and constant gain may be maintained over an entire dynamic range.

The essence of these first two methods of producing high efficiency in linear RF amplifiers is to vary the electrode potentials of an inherently linear amplifier in such a manner as to keep its efficiency high. However, it is not meant to imply that the power supply voltage must either follow only the gross syllabic envelope (as of speech) or else follow the fine structure of the envelope perfectly. These are merely the limits of operation. Any frequency response intermediate between these limits may be used with intermediate values of efficiency as long as the power supply is able to respond to the need for increased voltage as fast as the output stage demands it without an excessive amount of instantaneous overload.

With the high efficiency modulated switching mode non-linear RF power amplifier embodiment of FIGURE 3, an RF signal source 20' is connected for feeding an RF signal input to switching mode amplifier 29 from which an output is provided to antenna 28 or other appropriate load. This embodiment illustrates a switching type power modulator circuit 27' receiving inputs from an independent audio signal source 15 and a DC power supply 17 for developing an audio signal modulated output applied as an additional switching mode control input to the switching mode amplifier 29. The switching mode amplifier 29 and the switching modulator circuit 27' both approach 100 percent efficiency as the saturation resistance and switching time go to zero.

An important aspect of this invention with various embodiments is the provision of an improved method for amplifying an SSB signal by means of envelope modulation of the final RF amplifier. In contrast to some earlier developed techniques, it does not require limiting of the signal in earlier stages of the amplifier. In fact, it is preferable not to saturate the driver output to the power amplifier in the embodiment such as shown in FIGURE 2 since it needlessly burns up power in the input circuit of the power amplifier, thereby not only causing a wastage of power but also causing thermal dissipation of power in the power amplifier input junctions and/or electrodes. Peak drive is only required at the peak of the envelope and this will be supplied by a more or less linear driver. At the same time, perfect linearity of drive is not necessary since the envelope is reshaped by the output modulation process. In this case, however, in contrast to the class B linear amplifier with varying supply voltage, the modulated power supply must be very linear since any frequency, phase or amplitude distortion will cause imperfect envelope restoration, thus resulting in IM distortion generation.

Referring now the more detailed schematic of a high efficiency linear amplifier and of a high efficiency modulator embodiment of FIGURE 4, an individual audio signal source 15 is indicated just as in FIGURE 1 although it could be the sort of audio detecting and filtering system as employed in the embodiment of FIGURE 2. This provides an output through an adjustable tap 30 equipped voltage divider resistor 31, connected to ground, and through resistor 32 from the adjustable tap 30 as an input connection to a switching type power supply modulator circuit 27''. In this circuit the clock rate generator is included as an integral part of the switching type power supply modulator circuit 27'' instead of being a separate clock rate generator 14 as shown in FIGURE 1.

The audio input through resistor 32 is a connection to an audio frequency amplifier section including PNP transistor 33. This transistor 33 amplifier section includes an input connection through the resistor 32 to the base of transistor 33, a collector connection to minus DC voltage supply 34 through resistor 35, a capacitor 36 connected between the base and collector of transistor 33, and a base connection through resistor 37 to ground. The emitter of transistor 33 is connected to positive DC voltage supply 38 through resistor 39 and also through capacitor 40 to ground.

The collector output of the audio frequency amplifier section is connected through resistor 41 to the base of NPN transistor 42 in the clock generator and pulse width modulating section of the switching type power supply modulator circuit 27''. The emitter of transistor 42 is connected to ground while the junction of resistor 41 and the base of transistor 42 is connected to positive DC voltage supply 38 through resistor 43. The junction of resistor 41 and the base of NPN transistor 42 also is connected through resistor 44 and capacitor 45, in parallel, to the collector of PNP transistor 46 and through series connected resistors, successively, 47, 48 and 49 to ground. The collector of transistor 42 is connected through resistor 50 and capacitor 51, in parallel, to the base of PNP transistor 46. The collector of transistor 42 is also provided with a voltage bias connection through resistor 52 to positive DC voltage supply 38. The positive DC voltage supply 38 is also connected to the emitter of PNP transistor 46.

The common junction of resistors 47 and 48 is connected through a capacitor 53 to a common connection with the bases of PNP transistor 54 and NPN transistor 55 in a driver amplifier section of the switching type power supply modulator circuit 27''. The collector of PNP transistor 54 is connected to minus DC voltage supply 34 and the collector of NPN transistor 55 is connected to positive DC voltage supply 38. The common junction of resistors 48 and 49 is connected through capacitor 56 to a line 57 having a common connection with the emitters of PNP transistor 54 and NPN transistor 55. This line is extended to the primary coil 58 of a modulator output signal transformer 59. The signal output line 57 of the switching type power supply modulator circuit 27'' is also provided with a feedback extension 57A to and through resistor 60 back to the junction of resistor 32 and the base of PNP transistor 33 at the input end of the switching type power supply modulator circuit 27''.

The secondary coil 61 of the modulator circuit 27'' signal output transformer 59 is connected between the base and emitter of the NPN transistor switch 16', the collector of which is connected to positive DC power supply 17. The emitter of NPN switching type transistor 16' is connected to the cathode of a diode 62 having an anode connection to ground and also to and through a low pass filter circuit 63 including signal path series connected coils 64 and 65, and from the junction of coils 64 and 65 through capacitor 66 to ground. A further coil 67 may be provided in the output path to a tube as used in an output power amplifier circuit or, in lieu thereof, with other power amplifiers to, for example, the collector of an NPN transistor 68 having an emitter connection to ground and a base connection to an RF signal source 20'.

The output connection from the collector of RF power amplifier transistor 68 could be, as shown, through transmission line circuitry including capacitor 69 and coil 70 to antenna 28, and with the junction of coil 70 and the antenna lead connected through capacitor 71 to ground. It should be noted that separate voltage and/or power supplies were indicated in this embodiment since both the minus and positive biasing voltages for the switching type power supply modulator circuit 27'' are of relatively low power requirements. Whereas, on the other hand, the positive DC power supply 17 must be of sufficient power capability to supply the maximum power needs of the RF power output amplifier which in the embodiment of FIGURE 4 is NPN transistor 68 and the circuitry immediately associated therewith.

Referring also to FIGURE 5 for switching type power supply modulator waveforms, the average DC dashed line associated with waveform *a* is the average DC output for a transistor switch 16′ closed 95 percent of the time which for a certain adjustment of the circuitry corresponds to a positive peak of the input of the audio signal cycle with a substantially maximum width pulse providing a relatively high limit DC voltage output. With the average pulse width waveform *b*, the average DC line as indicated by a dashed line would be the waveform signal DC level corresponding to no audio input when the modulator is used in standard AM applications. Referring now to waveform *c* of FIGURE 5, the average DC output is indicated for the case when the transistor switch 16′ is closed only approximately 5 percent of the time in a modulated condition corresponding to a negative peak of an input audio cycle in standard AM applications and to what would be a no audio input when such circuitry is used as a DC amplifier (as a high efficiency linear amplifier, for example).

Referring generally to these various embodiments and to the waveforms of FIGURE 5, the syllabic envelope may be derived in some of the embodiments by detecting either the audio, DSB, or SSB signal, since they are practically identical as far as detected envelopes are concerned. The DC and syllabic envelope components are retained while audio and RF components are filtered out. In order that the highest efficiency may be attained, the pulse width at the output of a pulse width modulator as shown in FIGURE 4 is zero when the syllabic envelope is zero. That is, when no speech signals are present, the pulse width is substantially zero and the B+ output voltage is substantially zero. The syllabic envelope contains frequencies up to about 25 c.p.s., therefore, from information theory, the clock pulse rate must be at least 50 cycles per second. This produces a modulated B+ output spectrum which contains the original syllabic spectrum and also sidebands produced about the odd harmonics of the clock frequency. Since the first order sideband extends down from the clock frequency by the maximum frequency in the syllabic envelope it extends down to 25 c.p.s. In order to eliminate this sideband with a clock pulse rate of 50 c.p.s. a substantially perfect low pass filter with an infinitely sharp cut off of 25 c.p.s. is required, however, to simplify filter design, the clock rate may be increased and as a practical matter, generally is increased to levels approximating 50 kc. It should be noted that a voltage regulator could be provided either as a part of positive DC power supply 17 in the embodiment of FIGURE 4 or between the power supply 17 and the switching transistor 16′ in order to maintain a constant B+ input voltage to the switching transistor 16′ at a level at at least the maximum peak B+ required during power supply modulating action of transistor switch 16′ in providing the required power input levels through the switching transistor 16′ for a power amplifier circuit including NPN transistor 68.

Here again, it might be noted that for ideal zero bias class B triode operation, the gain is substantially constant from zero to the maximum DC plate or collector voltage, with only the plate overload point varying in proportion to the DC voltage. In a practical case since the plate current varies as the 3/2 power of voltage, it becomes necessary to vary the grid voltage to maintain constant linear amplifier gain. When using the syllabic filter with speech signals this may generally be neglected since it only involves a slight amount of syllabic compression or expansion to generally unnoticeable levels.

In the embodiments hereinbefore discussed, the transistor switches, actually may be replaced by three-element silicon controlled rectifiers and still be considered within applicants, teachings, operate at a fixed rate of speed in excess of the highest frequency to be amplified. Information theory indicates that this speed should be at least twice the highest frequency to be amplified and as pointed out hereinbefore, approximately 50 kc. as a practical matter has been shown to be optimum for normal voice or music since transistor switches, and the operational equivalent of such transistor switches, are available which operate at this speed and since operation at such higher switching speeds leads to filter design simplification. Obviously, restricted bandwidth systems allow lower switching frequencies for speech signal handling capabilities. In the previously discussed embodiments, the audio input signal varies pulse width of the "on" period for the transistor switches and further, the frequency of the audio input signal varies the rate of pulse width change, while the amplitude of the audio input signal controls the amount of pulse width change. In a further embodiment such as shown in FIGURE 6, a high efficiency linear amplifier is provided using a high efficiency modulator with a substantially constant width "on" period and variable width "off" period. This, obviously, with signal variation, results in frequency change in the operation of the switching transistor or its equivalent. This suggests other variations in workable systems where, for example, an "off" period could be constant with the pulse width "on" period varied in accordance with the audio input signal, and others could be provided with both "on" and "off" pulse portions of the signal being varied in accordance with the audio input signal.

Please refer to FIGURE 6 for specific details of a high efficiency amplifier 72 using a high efficiency modulator circuit 73 providing a constant width "on" pulse period and variable width "off" period. In this embodiment, just as with other embodiments, NPN transistor 16″ is in effect a series switch supplying current from positive DC power supply 17′ at a controlled rate to the filter coil 64′ in the B+ voltage supply path to the B+ modulated RF amplifier 22′ receiving an RF signal input from RF signal source 20′. Diode 62, just as in the other embodiments, is a commutating diode that conducts when the NPN switching transistor 16″ shuts off, maintaining current flow in coil 64′ and preventing the generation of large breakdown voltages across the NPN transistor 16″. In the embodiment, resistors 74 and 75 series connected between the input of RF power amplifier 22′ and ground form a voltage divider with the common junction of the resistors 74 and 75 connected to the base of PNP transistor 76 in the high efficiency modulator circuit 73. The resulting voltage applied from this voltage divider at the base of transistor 76 is proportional to the output voltage applied as a B+ voltage for the B+ modulated RF power amplifier 22′.

Audio signal low impedance source 15′ provides an output fed through Zener diode 77 and/or Zener diode 78 to the emitter of PNP transistor 76. Bypass switch 79 is provided in order that Zener diode 77 may be effectively in this circuit or not depending upon switch 79 being opened or closed in the signal input line from audio signal source 15′ to the emitter of transistor 76. The Zener diodes 77 and 78 are serially connected in the circuit, anodes toward the audio signal source 15′ and cathodes toward the emitter PNP transistor 76. Further, the common junction of Zener diode 78 and the emitter of PNP transistor 76 is serially connected through resistors 80 and 81 to positive DC power supply 17′.

The common junction of resistors 80 and 81 is connected through resistor 82 to the collector of NPN transistor 83 of the asymmetrical multivibrator circuit 84 portion of the high efficiency modulator circuit 73, and also through resistor 85 to the collector of NPN transistor 86 of the multivibrator circuit 84. The common junction of resistors 80 and 81 is also connected through resistor 87 to the base of NPN transistor 83 the emitter of which is connected to ground. The base of transistor 86 is connected to the collector of PNP transistor 76 as a controlling signal source input thereto and also through capacitor 88 to the collector of NPN transistor 83. The base of NPN transistor 83 is in turn connected through capacitor 89 to the collector of NPN transistor 86 and from the common junction of capacitor 89 and the collector of NPN transistor 86 through resistor 90 as an output signal modulating control signal path to the base of NPN transistor 91. The emitter of transistor 91 is connected to ground and the collector output is connected to the base of NPN switching transistor 16″. A resistor 92 is connected between the base and the collector of NPN switching transistor 16″.

During operation of the embodiment of FIGURE 6, the base-emitter junction of transistor 76 sums the modulating and regulating voltages that are amplified in transistor 76 and applied to the base of NPN transistor 86 of the asymmetrical multivibrator circuit 84 including transistors 86 and 83, resistors 82, 85, and 87, and capacitors 88 and 89. Capacitor 89 is made much smaller than capacitor 88 so that with no current flow in transistor 76 the ratio of "on" to "off" time of NPN transistor 86 is low. The heavier PNP transistor 76 conducts the faster capacitor 88 discharges and the shorter the "off" period of NPN transistor 86. Thus, by control of the current through PNP transistor 76 the "on" to "off" time to transistor 86 is varied. The signal output of transistor 86 and of the asymmetrical multivibrator circuit 84 is coupled to NPN transistor amplifier 91 by the connection of the collector of transistor 86 through resistor 90 to the base of amplifier transistor 91 to in turn drive the base of switching NPN transistor 16″. It should be noted that the Zener diode 93 connected cathode to common junction of resistors 80 and 81 and anode to ground insures a regulated supply voltage level at the junction of resistors 80 and 81 for the asymmetrical multivibrator circuit 84.

When AM modulator type operation is desired, switch 79 is controlled so that Zener diode 77 is effectively in the input signal circuit with a voltage drop across Zener diode 77 and Zener diode 78 greater than the resistive value of resistor 74 divided by the sum of the values of resistors 74 and 75 overall quantity times the output B+ voltage as it is applied as the B+ modulating voltage for the RF amplifier 22′ so that PNP transistor 76 conducts. The current flowing in transistor 76 is such that the "on-off" duty cycle of switching transistor 16″ produces the DC B+ output voltage required for the desired RF carrier output. In order for full modulation to be attainable, the output B+ voltage under carrier only conditions must be produced by, at most, a 50 percent duty cycle. Full modulation is only possible with less than 50 percent carrier duty cycle, otherwise clipping and distortion problems may be encountered and upward of 100 percent modulation is impossible. The regulating output is provided with an increase in the voltage level of possible DC power supply 17′ resulting in an increase in the output B+ voltage being applied to RF amplifier 22′. This results in a corresponding decrease in the current in PNP transistor 76 and thereby a longer "off" time for NPN transistor 86. This increases the "on" time of NPN transistor 91 and thereby decreases the "on" time of NPN switching transistor 16″ to thereby lower the cutput B+ voltage being applied to RF amplifier 22′ toward the original B+ voltage value.

Modulation voltage applied from signal source 15′ to the emitter of transistor 76 through Zener diodes 77 and 78 ideally swings the output B+ voltage between zero and double the available B+ voltage value for the particular moment time interval involved. During the negative half cycle of the modulating signal wave, the emitter voltage of transistor 76 is lowered thereby reducing the current in transistor 76. This lengthens the "off" period of transistor 86 thereby in turn shortening the "off" period of transistor 91 and lengthening it in the switching transistor 16″ thereby reducing the output B+ voltage supplied to RF amplifier 22′ and correspondingly reducing the voltage at the base of transistor 76. This in effect is a negative feedback for the modulating voltage with a beneficial reduction of signal distortion in the system. In like manner, the positive half cycle of the modulating wave increases the level of emitter voltage on transistor 76 thereby increasing the current through transistor 76. This shortens the "off" period of transistor 86 thereby lengthening the "off" period of transistor 91 and shortening the "off" period of switching transistor 16″ thereby raising the level of the output B+ voltage applied to RF amplifier 22′.

A unidirectional modulation voltage is employed for SSB operation with this modulation voltage obtained by rectification of either audio or SSB signal in accord with such methods as hereinbefore described. It should be noted that signal sources 20′ may be an SSB, or DSBSC, generator as previously described. With such usage, it is desired that the DC output B+ voltage be substantially zero with zero modulating voltage. This is accomplished with the embodiment of FIGURE 6 by closing switch 79 to short out Zener diode 77 and thereby lowering the voltage level at the emitter of PNP transistor 76 to cutoff with no modulation voltage signal input. With transistor 76 at this cutoff condition, the "off" period of transistor 86 is lengthened and the output B+ voltage applied to RF amplifier 22′ drops to a low value. With this condition of operation, a positive unidirectional voltage applied to the emitter input of transistor 76 through Zener diode 78 causes a proportional amount of current flow through transistor 76 resulting in an output B+ voltage applied to RF amplifier 22′ proportional to the unidirectional modulating voltage input applied by audio signal source 15′ through Zener diode 78.

Whereas this invention is here illustrated and described with respect to several embodiments thereof, it should be realized that various changes may be made without departing from essential contributions to the art made by the teachings hereof.

We claim:

1. In a high efficiency RF power amplifier and modulation system: an RF power amplifier; an RF signal source; a circuit interconnection between said RF signal source and said RF power amplifier; a DC power supply; electrode means in said RF power amplifier; circuit means interconnecting said DC power supply and said electrode means; an "on"-"off" switch in the circuit means interconnecting said DC power supply and electrode means in said RF power amplifier; a modulating signal source; and a modulation circuit interconnecting said modulating signal source and said "on"-"off" switch for control drive of said switch and variance of the "on" to "off" time of said switch in accordance with the signal from the modulating signal source.

2. The high efficiency RF power amplifier and modulation system of claim 1, wherein said "on"-"off" switch in the circuit means interconnecting said DC power supply and electrode means in said RF power amplifier is a solid state electronic type switch.

3. The high efficiency RF power amplifier and modulation system of claim 2, wherein said "on"-"off" switch is a transistor.

4. The high efficiency RF power amplifier and modulation system of claim 1, including feedback circuit means from a portion of the circuit means interconnecting said DC power supply and said electrode means adjacent said electrode means of the RF power amplifier to the modulation circuit interconnecting said modulating signal source and said "on"-"off" switch.

5. The high efficiency RF power amplifier and modulation system of claim 4, including a low pass filter in the circuit between said "on"-"off" switch and electrode means of said RF power amplifier and with the feedback circuit means connected to the portion of the circuit between said low pass filter and said electrode means.

6. The high efficiency RF power amplifier and modulation system of claim 1, wherein the modulator circuit includes a pulse width modulator with cycle timing circuit means.

7. The high efficiency RF power amplifier and modulation system of claim 6, wherein the cycle timing circuit means is set to provide a minimum pulse cycle rate of at least fifty cycles per second.

8. The high efficiency RF power amplifier and modulation system of claim 6, wherein the cycle timing circuit means is set at a clock pulse cycle rate of approximately 50 kc. per second.

9. The high efficiency RF power amplifier and modulation system of claim 1, wherein the modulation circuit includes an asymmetrical multivibrator circuit to vary the width of "off" periods in accordance with the modulating input signal from the modulating signal source.

10. The high efficiency RF power amplifier and modulation system of claim 1, wherein said modulating signal source is connected to provide a modulating signal input directly to said RF signal source; and an envelope detector and syllabic filter circuit is connected to the circuit interconnecting said RF signal source and said RF power amplifier and to the modulation circuit for feeding the detected and syllabic filter passed signal as the modulating signal input to said modulation circuit.

11. The high efficiency RF power amplifier and modulation system of claim 10, with the connection from the envelope detector and syllabic filter circuit to the modulation circuit including a signal mixer; a low pass filter in the circuit between said "on"-"off" switch and the electrode means of said RF power amplifier; and a feedback circuit including a feedback regulator connected between the portion of the circuit between said low pass filter and said electrode means, and said signal mixer.

12. The high efficiency RF power amplifier and modulation system of claim 11, including a low power level RF class A amplifier in the circuit interconnecting said RF signal source and said RF power amplifier between the RF signal source and the connection with said envelope detector and syllabic filter circuit.

13. The high efficiency RF power amplifier and modulation system of claim 12, including a driver amplifier stage in the circuit interconnecting said RF signal source and said RF power amplifier between the low power level RF class A amplifier and said RF power amplifier.

14. The high efficiency RF power amplifier and modulation system of claim 13, wherein said low pass filter has an output connection with both said electrode means of said RF power amplifier, and said driver amplifier stage.

15. The high efficiency RF power amplifier and modulation system of claim 1, wherein the modulator circuit includes a multivibrator circuit; multiple impedance means are included in a circuit between said modulating signal source and said modulator circuit; and switch means is provided for controlled switching of one of said multiple impedance means effectively into or out of the circuit for selective shifting of ranges of modulation operation.

16. The high efficiency RF power amplifier and modulation system of claim 15, wherein said multiple impedance means are series connected Zener diodes; and at least one of said Zener diodes is paralleled by a shorting switch as the switch means for controlled switching of one of said multiple impedance means effectively into or out of the circuit.

17. The high efficiency RF power amplifier and modulation system of claim 16, wherein the modulation circuit is set to provide substantially zero DC output voltage at the electrode means of said RF power amplifier when the shortening switch is thrown to short out a Zener diode.

18. The high efficiency RF power amplifier and modulation system of claim 17, wherein the modulation circuit is set to provide a maximum DC output voltage at the electrode means of said power amplifier when the shorting switch is thrown to include all Zener diodes effectively in the circuit between said modulating signal source and said modulating circuit that insures, at most, a maximum 50 percent duty cycle and full modulation in operation of the system.

References Cited

UNITED STATES PATENTS

| | | | |
|---|---|---|---|
| 2,968,010 | 1/1961 | Case | 332—9 X |
| 3,072,854 | 1/1963 | Case | 332—9 X |
| 3,252,100 | 5/1966 | Webb | 307—265 |
| 3,290,617 | 12/1966 | Bellem | 332—14 |

ALFRED L. BRODY, *Primary Examiner.*